(12) United States Patent
Rowan et al.

(10) Patent No.: US 8,693,856 B2
(45) Date of Patent: Apr. 8, 2014

(54) APPARATUS AND METHODS FOR VACUUM-COMPATIBLE SUBSTRATE THERMAL MANAGEMENT

(75) Inventors: Jason Keith Rowan, San Jose, CA (US); Li-Min Chen, San Jose, CA (US); Roni Robinzon, Timrat (IL); Christopher Vreje Ohanian, Glendale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 306 days.

(21) Appl. No.: 12/875,720

(22) Filed: Sep. 3, 2010

(65) Prior Publication Data

US 2012/0057856 A1    Mar. 8, 2012

(51) Int. Cl.
F24H 1/34 (2006.01)

(52) U.S. Cl.
USPC .......................................... 392/416

(58) Field of Classification Search
USPC ............ 392/416, 418; 219/494, 502; 250/307
See application file for complete search history.

(56) References Cited

U.S. PATENT DOCUMENTS

| | | | |
|---|---|---|---|
| 7,019,263 B2 * | 3/2006 | Ishihara | 219/390 |
| 7,285,445 B2 | 10/2007 | Owen et al. | |
| 2004/0175906 A1 | 9/2004 | Edo | |
| 2004/0187452 A1 | 9/2004 | Edo | |
| 2004/0263823 A1 | 12/2004 | Klomp et al. | |
| 2005/0054217 A1 | 3/2005 | Klomp et al. | |
| 2005/0077280 A1 * | 4/2005 | Ptak | 219/390 |
| 2005/0118002 A1 | 6/2005 | Kasumit | |
| 2005/0186716 A1 | 8/2005 | Kasumi | |
| 2007/0178748 A1 | 8/2007 | Kasumi | |
| 2008/0003081 A1 | 1/2008 | Kasumi | |
| 2008/0138177 A1 | 6/2008 | Klomp et al. | |
| 2008/0170842 A1 * | 7/2008 | Hunter et al. | 392/416 |
| 2009/0309022 A1 * | 12/2009 | Gunji et al. | 250/307 |

FOREIGN PATENT DOCUMENTS

| | | | |
|---|---|---|---|
| JP | 08-504301 A | | 5/1996 |
| JP | 2008-177300 A | | 7/2008 |
| JP | 2009-231825 A | | 10/2009 |
| KR | 2006062712 A | * | 6/2006 |
| KR | 10-0768912 B1 | | 10/2007 |

OTHER PUBLICATIONS

PCT International Search Report for Application No. PCT/US2011/049768, Apr. 9, 2012, 3 sheets.
PCT Written Opinion of the International Searching Authority for Application No. PCT/US2011/049768, Apr. 9, 2012, 4 sheets.

* cited by examiner

*Primary Examiner* — Dana Ross
*Assistant Examiner* — Renee L Miller
(74) *Attorney, Agent, or Firm* — Okamoto & Benedicto LLP

(57) ABSTRACT

One embodiment relates to an apparatus for vacuum-compatible substrate thermal management. The apparatus includes a load-lock chamber coupled to a vacuum chamber, a light-emitting diode array, and a substrate stage. The load-lock chamber is configured to hold a substrate prior to the substrate being transferred into the vacuum chamber, and a substrate stage is configured to hold the substrate in the vacuum chamber. The light-emitting diode array is configured to warm the substrate while the substrate is in the load-lock chamber. Other features, aspects and embodiments are also disclosed.

15 Claims, 6 Drawing Sheets

APPARATUS AND METHODS FOR VACUUM-COMPATIBLE SUBSTRATE THERMAL MANAGEMENT

BACKGROUND

1. Technical Field

The present invention relates to thermal management in an apparatus, such as an electron beam apparatus, for example.

2. Description of the Background Art

An automated inspection apparatus may be used to detect defects in a manufactured substrate. Defects (or potential defects) on the substrate are detected, and locations of the detected defects, relative to nearby reference sites on the substrate, are stored by the inspection apparatus.

Subsequent to the inspection, an automated review apparatus may be used to review the defect sites on the substrate. The substrate may be placed on a stage and loaded into a vacuum chamber of the review apparatus. A relatively large field of view (FOV), for example, tens of microns in width, may be used by the review apparatus to locate a reference site and then find the defect sites which are nearby the reference site. For each defect, a smaller FOV, for example, one micron in width, may be used to review the defect site in greater detail.

SUMMARY

Figure 1:
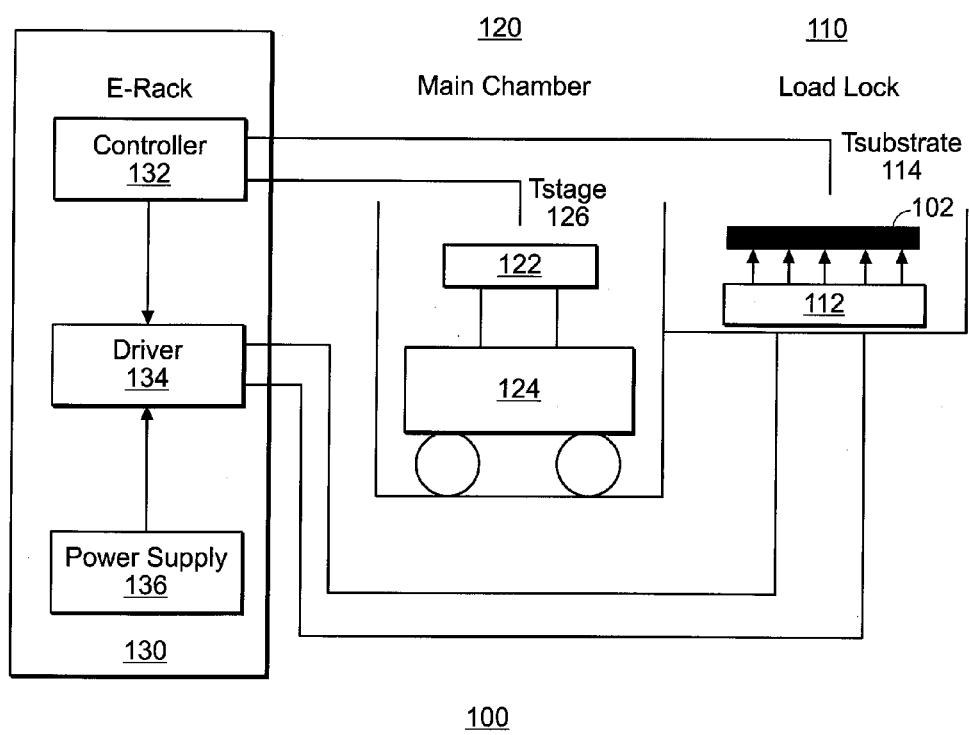
FIG. 1 is a schematic diagram showing an apparatus for vacuum-compatible substrate thermal management in accordance with an embodiment of the invention.

One embodiment relates to an apparatus for vacuum-compatible substrate thermal management. The apparatus includes a load-lock chamber coupled to a vacuum chamber, a light-emitting diode array, and a substrate stage. The load-lock chamber is configured to hold a substrate prior to the substrate being transferred into the vacuum chamber, and a substrate stage is configured to hold the substrate in the vacuum chamber. The light-emitting diode array is configured to warm the substrate while the substrate is in the load-lock chamber.

Another embodiment relates to a method of vacuum-compatible substrate thermal management. A substrate is loaded into a load-lock chamber coupled to a vacuum chamber, the load-lock chamber being configured to hold the substrate prior to the substrate being transferred into the vacuum chamber. The substrate is then warmed using a light-emitting diode array while the substrate is in the load-lock chamber. The substrate is then transferred from the load-lock chamber to a stage in the vacuum chamber.

Other features, aspects and embodiments are also disclosed.

DETAILED DESCRIPTION

Applicants have determined that, when a manufactured substrate, such as a semiconductor wafer or a reticle, is placed on a stage for the review apparatus, the substrate typically rises several degrees centigrade until it reaches the operating temperature of the stage. This causes the substrate to expand, typically by a few microns, until an equilibrium temperature is reached.

Unfortunately, this thermal expansion may not be done before the defect review procedure begins. In other words, as the defect sites are being reviewed one-by-one at the small FOV, the substrate may still be slowly expanding. After a while, the expansion may be sufficiently large such that the defect sites may be outside the expected small FOV. In that case, the inspection apparatus needs to revert to the larger FOV to again locate the nearby reference site and then find the defect site relative to the reference site. Such recalibrations result in wasted time and reduced throughput for the review apparatus.

In order to overcome the above-described problems and limitations, the present patent application discloses apparatus and methods for vacuum-compatible substrate thermal management. The apparatus and methods disclosed herein are essentially non-contact in that minimal contact is made with the target substrate.

In accordance with an embodiment of the invention, the slow thermal expansion described above may be substantially reduced or eliminated by actively warming (heating) the manufactured substrate. The substrate may be actively warmed before the initial calibration so that the substrate temperature matches the stage temperature from the beginning of the review procedure. This advantageously eliminates the need to recalibrate using the reference sites and so prevents unnecessary reductions in throughput.

In one embodiment, a closed-loop controlled light-emitting diode (LED) array may be utilized to raise the temperature of the incoming substrate to match that of the stage while the stage is in an initial vacuum-pumping chamber. The LED array may be configured such that its radiative output is sufficient to heat the substrate to the stage temperature within the approximately ten seconds or less during which the substrate remains static in the vacuum-pumping chamber.

Applicants have further determined that, in comparison to radiative heating by an LED array, other heating techniques have substantial limitations. For example, applicants have considered conductive and/or convection heating techniques but found those techniques to be disadvantageous. Conductive heating requires large contact areas for rapid heating, and large contact areas increase the risk of substrate damage and/or particle creation inside the vacuum chamber. Convection heating requires a high-temperature gas source and may result in less repeatable heating.

Applicants have also considered infrared radiative heating using a high-temperature metallic plate ("a hot plate"), but the necessary radiative output requires the hot plate to operate at an unreasonably high temperature. This results in a slow-response system with no direct means of shutting off the radiation source. Moreover, maintaining the operating temperature of the hot plate requires a continuous, high-input power source and creates an undesirable high-temperature heat source within the tool. Finally, the hot plate presents a potential safety hazard.

Alternatively, software-based compensation algorithms executed by the controller of the review apparatus may track printed features to determine substrate expansion and implement compensation. However, such software-based solutions are ineffective when reviewing defects on a blank wafer (without reference sites). Moreover, the innovative LED array heating solution disclosed herein either obviates the need for software-based compensation, or may be used in conjunction with software-based compensation.

FIG. 1 is a schematic diagram showing an apparatus 100 for vacuum-compatible substrate thermal management in accordance with an embodiment of the invention. Shown in FIG. 1 are a load-lock chamber (load lock) 110, a main vacuum chamber (main chamber) 120, and an electronics rack (E-Rack) 130.

A target substrate 102, such as a semiconductor wafer or reticle, is loaded into the load-lock chamber 110. In accordance with an embodiment of the invention, a warming device 112 is configured to warm the substrate while the substrate is in the load-lock chamber 110. The warming device 112 may include a light-emitting diode array as described further below in relation to FIGS. 2A, 2B and 3. At least one temperature sensor (preferably multiple sensors) 114 measures the temperature of the substrate (Tsubstrate).

The electronics rack (E-rack) 130 includes a controller 132, driver circuitry 134, and a power supply 136. The driver circuitry 134 comprises circuitry for driving the light emitting diodes in the warming device 112. The driver circuitry 134 is coupled to the power supply 136 and to the light-emitting diodes in the warming device 112. The driver circuitry 134 is configured to drive an electrical current to the light-emitting diodes so that they generate a radiative output of photons to warm the target substrate.

The controller 132 in the electronics rack 130 may include a microcontroller, memory, data storage, interfaces, and other circuits. The controller 132 may also include program instructions (software) that are stored in the data storage, loaded into memory, and executed by the microcontroller. The program instructions are configured to perform some or all the monitoring and control operations described herein for the apparatus.

A closed-loop control system may be formed using the controller 132 to control the warming device 112. The controller 132 may be configured to obtain data from the temperature sensor(s) 114 so as to monitor the temperature of the substrate 102. The controller 132 may further be configured to control the driver circuitry 134. The driver circuitry 134 is controlled so as to drive current to the light-emitting diodes of the warming device 112 such that the target substrate 102 is warmed in the load-lock chamber 110. The driver circuitry 134 is further controlled so as to shut-off current to the light-emitting diodes upon the measured temperature of the substrate 102 reaching a target temperature.

In accordance with an embodiment of the invention, at least one temperature sensor (preferably multiple sensors) 126 measures the temperature of the substrate holding stage 122 (Tstage) in the main vacuum chamber 120. Tstage may be used as the target temperature for Tsubstrate.

After the light-emitting diodes in the warming device 112 are turned off, the substrate 102 may be mechanically transferred from the load-lock chamber 110 to a substrate holding stage 122 in the main vacuum chamber 120. While on the stage 122, the substrate may be imaged. The substrate holding stage 122 may include mechanisms 124 for moving the stage under the imaging beam. For example, if the main vacuum chamber 120 is that of an electron beam review instrument, then the imaging may be performed by generating an incident electron beam, scanning the incident electron beam over a field of view, and detecting scattered radiation (for example, secondary electrons) that are emitted as a result of the scanning.

Figure 2A:
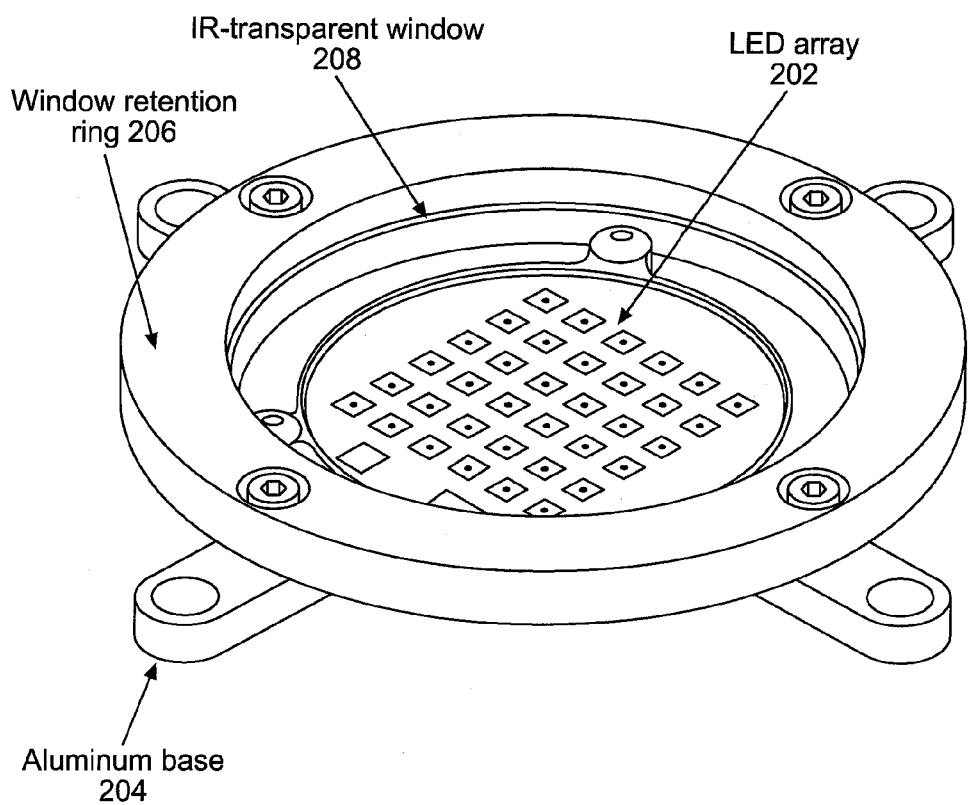
FIG. 2A is a perspective view of a light-emitting diode warming apparatus in accordance with an embodiment of the invention.
Figure 2B:
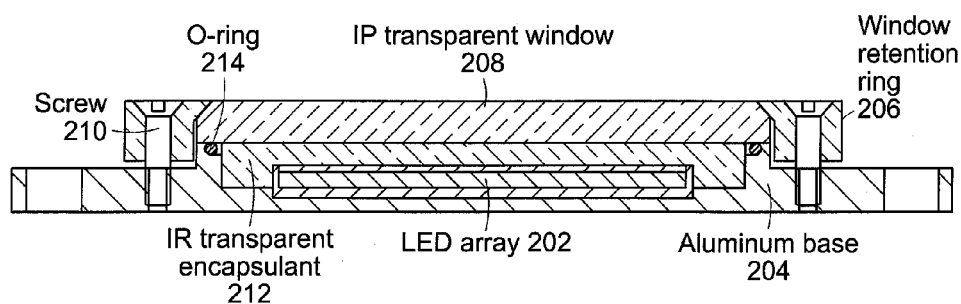
FIG. 2B is a cross-sectional view of the light-emitting diode warming apparatus shown in FIG. 2A.

FIG. 2A is a perspective view of a light-emitting diode (LED) warming apparatus 200 in accordance with an embodiment of the invention, and FIG. 2B is a cross-sectional view of the light-emitting diode warming apparatus shown in FIG. 2A. The LED warming apparatus 200 may be utilized as the warming device 112 in FIG. 1. As shown, the LED warming apparatus 200 includes an LED array 202 an aluminum base 204, a window retention ring 206, and a window 208.

The LED array 202 includes an arrangement of LED devices which may be fixed onto a base 204. The LED devices may be controlled by way of interface wires to the LED driver circuitry 134.

The base 204 may be made of aluminum, for example. A window retention ring 206 may be used to hold the window 208 over the LED array 202. As shown, screws 210 may be used to connect the window retention ring 206 to the base 204 and thus secure the window 208 into position. A transparent encapsulant 212 may cover the LED array 202 and fill the space between the window 208. The encapsulant 212 is preferably transparent to infrared radiation from the LED array 202. An O-ring 214 may be utilized at the junction between the window 208 and the base 204 so as to seal the volume The window 208 may be an infrared-transparent (IR-transparent) window such that infrared light passes through the window. More generally, the window 208 should be transparent, or substantially transparent, to wavelengths of light that are emitted from the LED array 202 and are used to warm the substrate 102.

Figure 3:
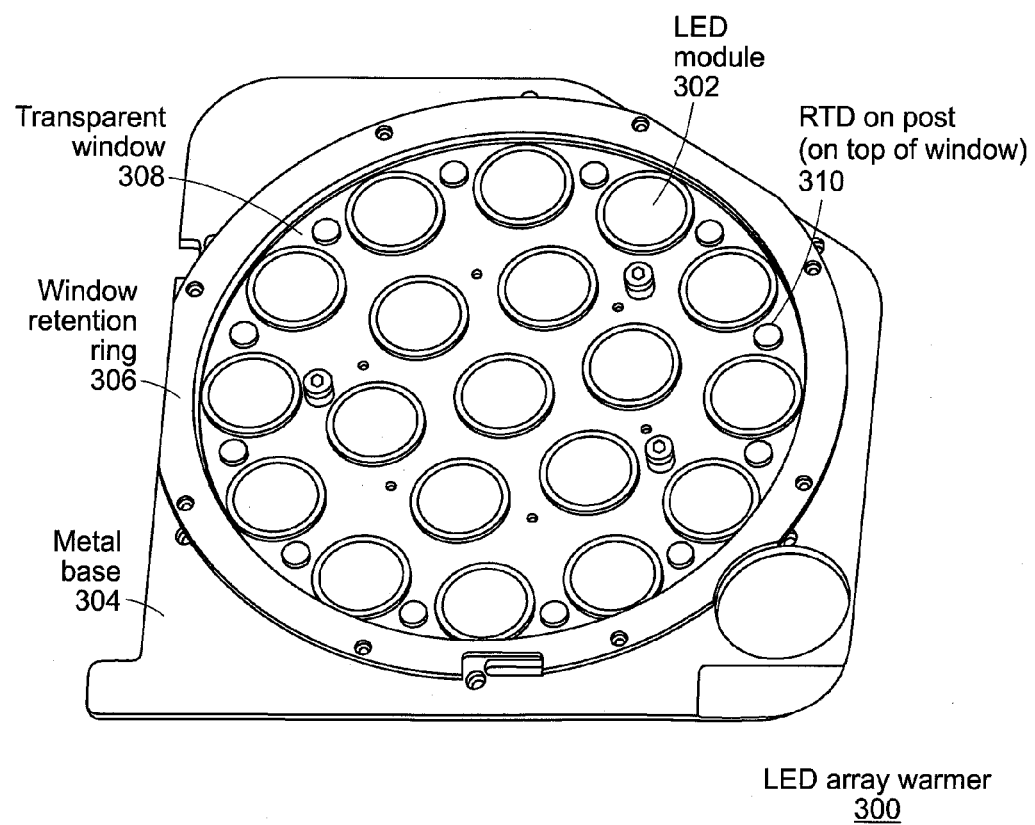
FIG. 3 is a perspective view of a light-emitting diode warming apparatus in accordance with another embodiment of the invention.

FIG. 3 is a perspective view of a light-emitting diode warming apparatus in accordance with another embodiment of the invention. As shown, several LED modules 302 are attached to a base 304 and arranged in an axisymmetric pattern about a center point.

Each LED module 302 may have a maximum radiative output power of 250-500 milliwatts each, for example, and may be capable of outputting light at reduced power levels (below the maximum). While the embodiment in FIG. 3 shows 19 LED modules (capable of a maximum total radiative output power of between 5 to 10 watts each, for example), applicants contemplate that other embodiments may be implemented with various numbers of LED modules. For example, the number of LED modules may be seven at a low end and perhaps one hundred at a high end. Since the LED modules may be driven at lower power levels (below the maximum), the total radiative power output may range from zero watts to the maximum total radiative power output.

Similar to the embodiment in FIGS. 2A and 2B, the base 304 may be fabricated from a metal, such as aluminum, and a window retention ring 306 may be used to hold a transparent window 308 above the LED modules 302. Also similar to the embodiment in FIGS. 2A and 2B, an O-ring may be used between the window 308 and the base 304, and a transparent encapsulant may cover the LED modules 302. The window and encapsulant may be transparent to infrared radiation, or, more generally, should be sufficiently transparent to a range of frequencies to allow for the LED modules 302 to warm the substrate 102 in a short period of time (preferably thirty seconds or less, for example).

In this embodiment, a few to several (in this case, three) posts 310 are attached to a top side of the window 308. The target substrate is placed on top of the posts 310 in the load-lock chamber 110. Moreover, the top of the posts 310 may be configured with the temperature sensors 114 to measure the target substrate's temperature (Tsubstrate). In one embodiment, the temperature sensors may comprise resistance temperature detectors.

Figure 4:
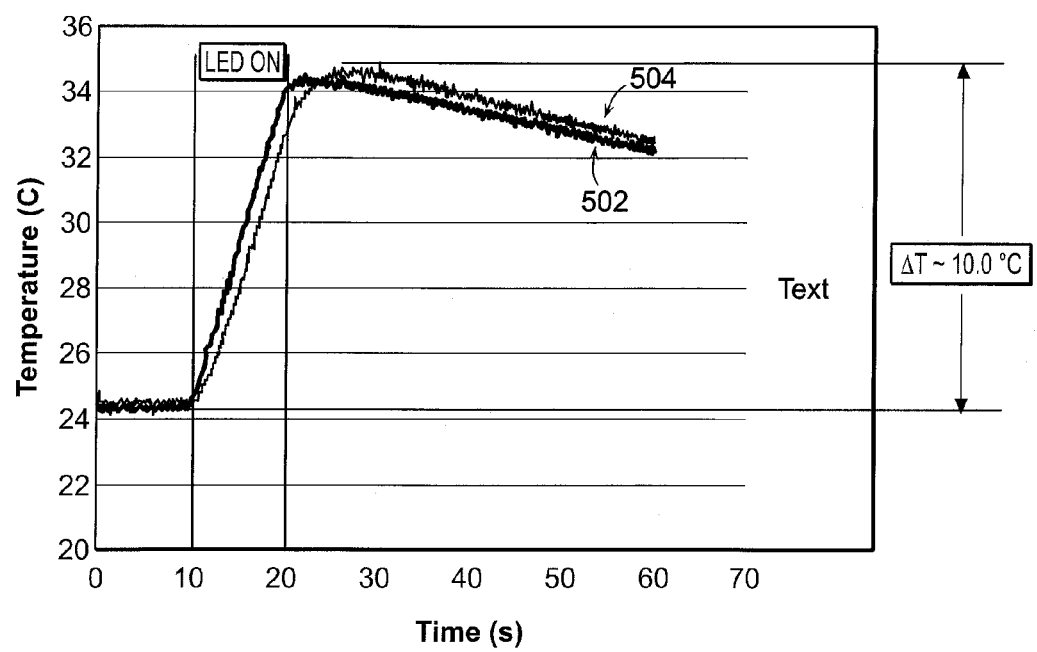
FIG. 4 is a graph of temperature versus time showing the warming achieved by an apparatus accordance with an embodiment of the invention.

FIG. 4 is a graph of temperature versus time showing the warming achieved by an apparatus accordance with an embodiment of the invention. As seen, the LED array of the warming device 112 is turned on so as to heat the substrate 102 at the 10 second mark and turned off at the 20 second mark.

Shown in FIG. 4 are two data curves. The first curve 502 shows the temperature measured at the bottom surface of the target substrate (in this case, a silicon wafer), while the second curve 504 shows the temperature measured at the top surface of the target substrate.

As seen, the bottom surface temperature 502 rises earlier than the top surface temperature 504 while the LED array is turned on. This is because the LED array shines light on the bottom of the substrate. The top surface temperature 504 peaks later because it takes time for the thermal energy to conduct through the substrate. In addition, note that having the LED array turned on for 10 seconds is seen to increase the measured temperatures by approximately 10 degrees centigrade.

Figure 5:
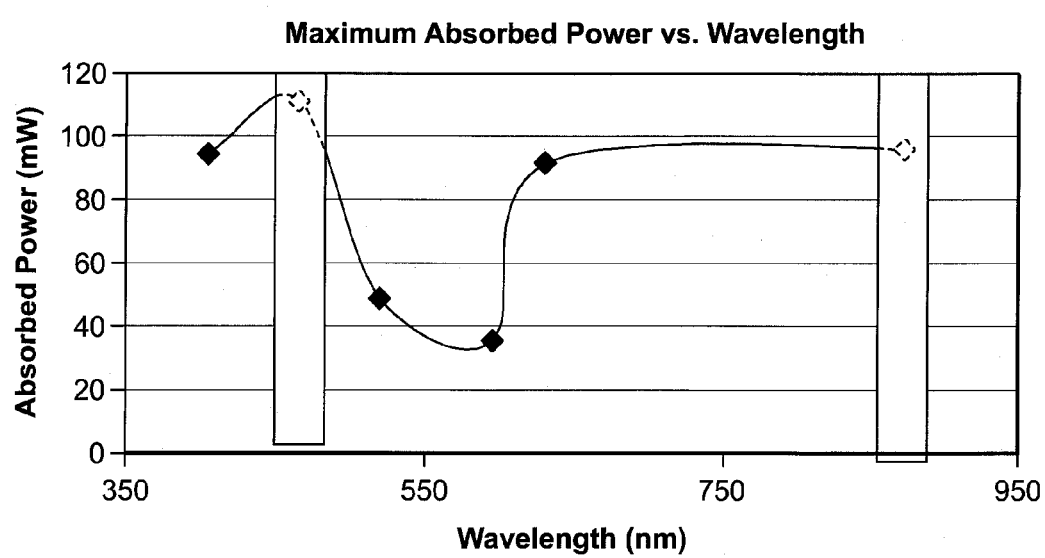
FIG. 5 is a graph of maximum absorbed power versus wavelength for a silicon wafer being warmed by an apparatus in accordance with an embodiment of the invention.

FIG. 5 is a graph of maximum absorbed power versus wavelength for a silicon wafer being warmed by an apparatus in accordance with an embodiment of the invention. Applicants have determined the maximum absorbed power by combining the maximum LED power output and the absorptivity of the substrate. As seen, for the LED devices used in this particular embodiment, the maximum absorbed power peaks at roughly 460 nanometers (nm), then goes into a trough at around 550 nm, and then appears to plateau from about 650 nm through about 900 nm.

The data points at 460 nm and 870 nm are highlighted as these are wavelengths that were particularly investigated by applicants.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for vacuum-compatible substrate thermal management, the apparatus comprising:
   a load-lock chamber coupled to a vacuum chamber, the load-lock chamber being configured to hold a substrate prior to the substrate being transferred into the vacuum chamber;
   a substrate stage configured to hold the substrate in the vacuum chamber;
   a metal base of the substrate stage;
   a light-emitting diode array arranged beneath a holding position of the substrate in the load-lock chamber such that a bottom side of the substrate is heated radiatively by the light-emitting diode array;
   a transparent window above the light-emitting diode array;
   a window retention ring securing the transparent window to the metal base;
   a plurality of posts attached to a top side of the transparent window, wherein the substrate is placed on top of the plurality of posts in the load-lock chamber; and
   a plurality of measurement sensors arranged at the top of the posts upon which the substrate rests for monitoring a temperature of the substrate.

2. The apparatus of claim 1, wherein a radiative output of the light-emitting diode array heats the substrate to a temperature of the substrate stage.

3. The apparatus of claim 2, wherein the light-emitting diode array is turned on to warm the substrate as the load-lock chamber is pumped down from ambient pressure to a vacuum level that is at an intermediate pressure between the ambient pressure and a high-vacuum pressure of the vacuum chamber.

4. The apparatus of claim 3, wherein the light-emitting diode array warms the substrate for a period of no more than thirty seconds before the substrate is transferred from the load-lock chamber to the vacuum chamber.

5. The apparatus of claim 1, wherein the light-emitting diode array comprises a plurality of light-emitting diode modules which are encapsulated and assembled onto a base.

6. The apparatus of claim 1, wherein the diodes of the light-emitting diode array are arranged in an axisymmetric pattern beneath the holding position of the substrate in the load-lock chamber.

7. The apparatus of claim 1, wherein the light-emitting diode array is configured with a radiative power output of up to two hundred watts.

8. The apparatus of claim 1, further comprising:
   a housing that holds the light-emitting diode array and that is hermetically sealed from the load-lock chamber, the housing including the transparent window through which light from the light-emitting diode array shines onto the substrate.

9. The apparatus of claim 1, further comprising:
   a power supply;
   driver circuitry coupled to the power supply and to the light-emitting diode array, the driver circuitry being configured to drive an electrical current to the light-emitting diode array so as to generate a radiative output; and
   closed-loop control circuitry coupled to the driver circuitry and the measurement sensors.

10. The apparatus of claim 9, wherein upon the measured temperature of the substrate reaching a target temperature, the control circuitry causes the driver circuitry to shut-off current to the light-emitting diode array.

11. The apparatus of claim 9, wherein the measurement sensors comprise resistance temperature detectors configured to be in thermal contact with the substrate being held in the load-lock chamber.

12. The apparatus of claim 1, wherein the light-emitting diodes in the array are configured to output light with a wavelength of 400 nanometers or longer.

13. The apparatus of claim 12, wherein the light-emitting diodes in the array are configured to output light with a wavelength no longer than 900 nanometers.

14. The apparatus of claim 1, wherein the apparatus for vacuum-compatible substrate thermal management is part of an apparatus for reviewing previously-detected defects in the substrate.

15. An apparatus for vacuum-compatible substrate thermal management, the apparatus comprising:
- a substrate stage configured to hold the substrate in the vacuum chamber;
- a metal base of the substrate stage;
- a light-emitting diode array arranged beneath a holding position of the substrate in the load-lock chamber such that a bottom side of the substrate is heated radiatively by the light-emitting diode array;
- an infrared-transparent window above the light-emitting diode array;
- a window retention ring;
- a mechanism to connect the window retention ring to the metal base so as to secure the infrared-transparent window in place;
- an O-ring at a junction between the infrared-transparent window and the base; and
- an infrared-transparent encapsulant covering the light-emitting diode array and filling a space between the light-emitting diode array and the infrared-transparent window.

\* \* \* \* \*